(12) United States Patent
Hyun et al.

(10) Patent No.: US 10,706,787 B2
(45) Date of Patent: Jul. 7, 2020

(54) DISPLAY DEVICE AND METHOD OF INSPECTING THE SAME

(71) Applicant: Samsung Display Co., Ltd., Yongin-si (KR)

(72) Inventors: Chang Ho Hyun, Seoul (KR); Geun Yeong Chang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/394,535

(22) Filed: Apr. 25, 2019

(65) Prior Publication Data

US 2020/0020281 A1    Jan. 16, 2020

(30) Foreign Application Priority Data

Jul. 13, 2018   (KR) .................. 10-2018-0081471

(51) Int. Cl.
   *G09G 3/32*        (2016.01)
   *G09G 3/3275*      (2016.01)
   *G01R 27/20*       (2006.01)
   *G01R 31/44*       (2020.01)

(52) U.S. Cl.
   CPC ......... *G09G 3/3275* (2013.01); *G01R 27/205* (2013.01); *G01R 31/44* (2013.01); *G09G 2310/0291* (2013.01); *G09G 2310/08* (2013.01)

(58) Field of Classification Search
   CPC ............. G01R 27/205; G01R 31/44; G09G 2310/0291; G09G 2310/08; G09G 3/3275
   USPC .................................... 345/87, 204
   See application file for complete search history.

(56) References Cited

U.S. PATENT DOCUMENTS

| | | | |
|---|---|---|---|
| 2006/0181526 A1* | 8/2006 | Ota .................. | G09G 3/006 345/204 |
| 2007/0120789 A1* | 5/2007 | Lee .................. | G09G 3/3648 345/87 |
| 2017/0186384 A1* | 6/2017 | Iwasa ............... | G09G 3/2022 |

FOREIGN PATENT DOCUMENTS

KR    10-2008-0082855    9/2008

\* cited by examiner

*Primary Examiner* — Tony O Davis
(74) *Attorney, Agent, or Firm* — H.C. Park & Associates, PLC (57) ABSTRACT

A display device including a display panel including a plurality of pixels connected to a plurality of data lines and a plurality of gate lines crossing the plurality of data lines; a data driver comprising a plurality of terminals in contact with a plurality of pads on the display panel through a conductive adhesive member and configured to detect a resistance value of the plurality of terminals; and a timing controller configured to transfer the resistance value to an external controller.

17 Claims, 8 Drawing Sheets

DISPLAY DEVICE AND METHOD OF INSPECTING THE SAME

CROSS-REFERENCE TO RELATED APPLICATION

This application claims priority from and the benefit of Korean Patent Application No. 10-2018-0081471, filed on Jul. 13, 2018, which is hereby incorporated by reference for all purposes as if fully set forth herein.

BACKGROUND

Field

Exemplary embodiments of the invention relate generally to a display device and a method of inspecting the display device and, more specifically, to a display device for inspecting defects by using a data driver and a method of inspecting the display device.

Discussion of the Background

Display devices currently in use include liquid crystal display (LCD) devices and organic light emitting display (OLED) devices. An LCD device includes an LCD panel, which displays an image using a photo-transfer rate of an LC and a backlight assembly, which is disposed under the LCD panel and provides the LCD panel with light. An OLED device includes an OLED panel, which includes an OLED diode emitting a light by a recombination of electrons and pores. The OLED device has a fast response time and low power consumption.

Manufacturing processes of these display devices include various defect inspection processes. The inspection processes include an array inspection process in which electrical defects are tested, and a lighting inspection process in which lighting defects are tested prior to a module assembly process.

After the array inspection process and the lighting inspection process, a module assembly process is performed. In the module assembly process, a polarizing plate, a protection film, a driving chip, and a flexible circuit board are adhered on the LCD panel or the OLED panel.

After the module assembly process, a bonding inspection process, which inspects bonding defects, such as drive chips and flexible circuit boards, and a reliability inspection process, which inspects reliability defects, such as a high temperature test, an age test, and an afterimage test, are performed.

The above information disclosed in this Background section is only for understanding of the background of the inventive concepts, and, therefore, it may contain information that does not constitute prior art.

SUMMARY

Exemplary embodiments of the inventive concept provide a display device for inspecting defects by using a data driver.

Exemplary embodiments of the inventive concept also provide a method of inspecting the display device.

Additional features of the inventive concepts will be set forth in the description which follows, and in part will be apparent from the description, or may be learned by practice of the inventive concepts.

According to an exemplary embodiment of the inventive concept, there is provided an display device including a display panel including a plurality of pixels connected to a plurality of data lines and a plurality of gate lines crossing the plurality of data lines; a data driver including a plurality of terminals in contact with a plurality of pads on the display panel through a conductive adhesive member and configured to detect a resistance value of the plurality of terminals; and a timing controller configured to transfer the resistance value to an external controller.

The plurality of terminals of the data driver may include an align electrode terminal arranged in an align electrode pad disposed on the display panel, and the data driver may be configured to detect the resistance value of the align electrode terminal contacted to the align electrode pad.

The display panel may further include a switching part disposed in an area adjacent to the data driver, and the switching part including a switching control line, and a switch connected to the switching control line, an odd numbered fan-out line, and an even numbered fan-out line adjacent to the odd numbered fan-out line.

The data driver may provide the switching control line with a switching control signal for turning on the switch, and detect the resistance value of the plurality of terminals when the switching part is turned on.

The switching part may include a switching control line; a first switch connected to the switching control line, and the odd and even numbered fan-out lines connected to terminals of a first group among the plurality of terminals of the data driver; and a second switch connected to the switching control line, and the odd and even numbered fan-out lines connected to terminals of a second group among the plurality of terminals of the data driver.

The data driver may provide the switching control line with a switching control signal for turning on the switch, and detect the resistance value of the terminals of the first group and the resistance value of the terminals of the second group, when the switching part is turned on.

The data driver may include an output buffer configured to amplify a data voltage corresponding to image data and output the data voltage to the plurality of the data lines and an inspecting part configured to detect the resistance value.

The inspecting part may block an operating voltage from being applied to the output buffer in an inspection mode in which the resistance value is detected.

The inspecting part may output a test signal to the plurality of data lines in an inspection mode which inspects whether the plurality of data lines has electrical defects.

The inspecting part may block an operating voltage from being applied to the output buffer in the inspection mode.

According to an exemplary embodiment of the inventive concept, there is provided a method of inspecting a display device which includes a plurality of pixels connected to a plurality of data lines and a plurality of gate lines crossing the plurality of data lines and a data driver comprising a plurality of terminals in contact with a plurality of pads on the display panel through a conductive adhesive member, the method including detecting a resistance value of the plurality of terminals, by the data driver, and transferring the resistance value to an external controller.

The plurality of terminals of the data driver may include an align electrode terminal arranged in an align electrode pad disposed on the display panel, and the data driver may detect the resistance value of the align electrode terminal contacted to the align electrode pad.

The method may further include turning on a switch connected to an odd numbered fan-out line and an even numbered fan-out line adjacent to the odd numbered fan-out line, by the driver, and detecting the resistance value of the plurality of terminals of the data driver which is connected to the odd and even numbered fan-out lines, by the driver.

The method may further include turning on a first switch connected to the switching control line, and the odd and even numbered fan-out lines connected to terminals of a first group among the plurality of terminals, by the driver; turning on second switch connected to the switching control line, and the odd and even numbered fan-out lines connected to terminals of a second group among of the plurality of terminals, by the driver; and detecting the resistance value of the terminals in the first and second group, by the driver.

The data driver may include an output buffer configured to amplify a data voltage corresponding to image data and output the data voltage to the plurality of the data lines, and the data driver blocks an operating voltage from being applied to the output buffer in an inspection mode in which the resistance value is detected.

The method may further include outputting a test signal to the plurality of data lines in an inspection mode in which inspects whether the plurality of data lines has electrical defects, by the data driver.

The method may further include blocking an operating voltage from being applied to the output buffer in the inspection mode, by the data driver.

According to the inventive concept, the data driver detects the resistance value of output terminals in the data driver bonded on the display panel and the resistance value is displayed on the monitor. Thus, the bonding inspection process may be automated. In addition, the data driver may perform the bonding inspection process and the array inspection process and thus, the inspection processes may be performed accurately.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the inventive concept will be explained in detail with reference to the accompanying drawings.

Figure 1:
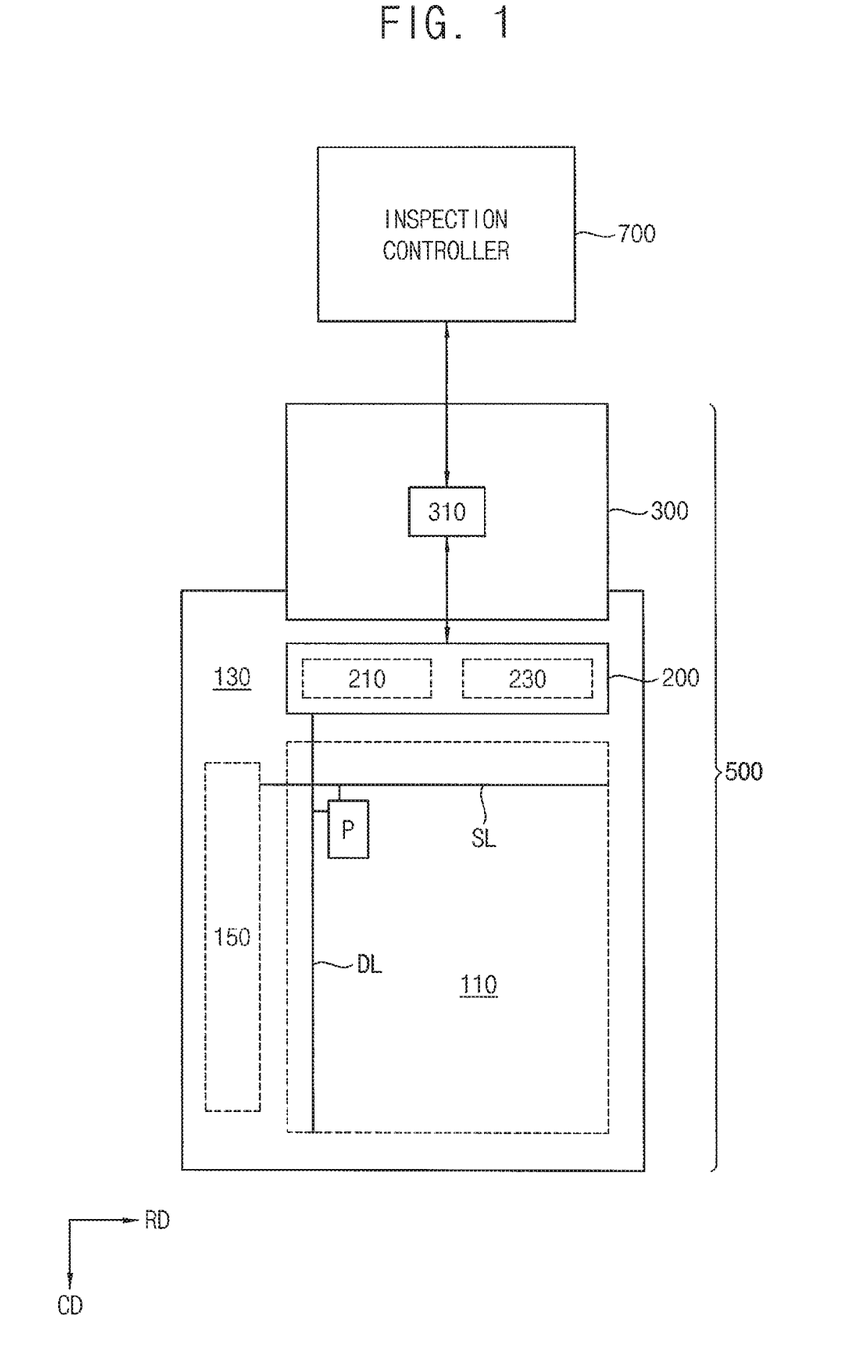
FIG. 1 is a block diagram illustrating a display device according to an exemplary embodiment.

FIG. 1 is a block diagram illustrating a display device according to one exemplary embodiment.

Referring to FIG. 1, an inspection system may include a display device 500 and an inspection controller 700.

The display device 500 may include a display panel 100, a data driver 200, and a flexible circuit board 300.

The display panel 100 may include a display part 110, a peripheral part 130, and a scan driver 150.

The display part 110 may include a plurality of data lines DL, a plurality of scan lines SL, a plurality of emission lines (not shown), and a plurality of pixels P.

The plurality of data lines DL may extend in a column direction CD and be arranged in a row direction RD.

The plurality of scan lines SL may extend in the row direction RD and be arranged in the column direction CD.

The plurality of emission lines (not shown) may extend in the row direction RD and be arranged in the column direction CD.

The plurality of pixels P may be arranged as a matrix type which includes a plurality of pixel columns and a plurality of pixel rows. Each of the pixels P may include at least one transistor connected to a data line DL and a scan line SL, a storage capacitor, and a display element. The display element may be an LC capacitor or an OLED diode.

The display panel 100 includes the display part 110 and a peripheral part 130 surrounding the display part 110.

The scan driver 150 may be disposed in the peripheral part 130. The scan driver 150 may be disposed in the peripheral part 130, which is adjacent to an end portion of the scan line SL. The scan driver 150 may be generate a plurality of scan signals, and sequentially output the scan signals to the plurality of scan lines SL. The scan driver 150 may be formed via the process substantially the same as that forming the transistor in the pixel P on the peripheral part 130.

In an exemplary embodiment, when the display element in the pixel P is the OLED diode, the scan driver 150 may be further include an emission scan driver (not shown) which generates an emission scan signal for controlling an operation of the OLED diode.

The data driver 200 may be disposed on the peripheral part 130, which is adjacent an end portion of the data line DL.

The data driver 200 may be a chip-type including a plurality of terminals. The terminals of the data driver 200 include a plurality of input terminals receiving a plurality of input signals and a plurality of plurality of output terminals outputting a plurality of output signals. In addition, the terminals of the data driver 200 may include an align electrode terminal arranged in an align electrode terminal disposed on the peripheral part 130.

The plurality of terminals of the data driver 200 may be electrically and physically contacted to a plurality of pads in an area which the data driver 200 is disposed through a conductive adhesion member, such as an anisotropic conductive film (ACF).

The plurality of pads in the peripheral part 130 may include an input pad contacted to the input terminal of the data driver 200 and an output pad contacted to the output terminal of the data driver 200. In addition, a plurality of pads in the peripheral part 130 may include an align electrode pad overlapping with the align electrode pad of the data driver 200.

The data driver 200 may include a data signal processor 210 and an inspecting part 230.

The data signal processor 210 is configured to receive image data from the timing controller 310 by a horizontal period, convert the image data to a data voltage using a gamma voltage, and output the data voltage to the plurality of data lines DL, in a display mode in which the display device displays an image.

After bonding processes, the inspecting part 230 may be driven based on a control of the inspection controller 700 in a bonding inspection process, which inspects bonding defects between the data driver 200 and the display panel 100.

The inspecting part 230 is configured to detect a resistance value of the plurality of terminals of the data driver 200, which are in contact with the plurality of pads in the peripheral part 130.

For example, the inspecting part 230 is configured to detect the resistance value of the plurality of terminals of the data driver 200, which are in contact with the plurality of pads in the peripheral part 130, and to output the resistance value of the plurality of terminals of the data driver 200. The inspecting part 230 is configured to transfer the resistance value to the inspection controller 700 through the timing controller 310.

The flexible circuit board 300 may be disposed in the peripheral part 130 corresponding to an edge area of the display panel 100, which is adjacent to the data driver 200.

The timing controller 310 may be disposed on the flexible circuit board 300. Alternatively, although not shown in the figures, the timing controller 310 may be disposed in a printed circuit board connected to the flexible circuit board.

The timing controller 310 is configured to generally control an operation of the display device 500. The timing controller 310 may be connected to the inspection controller 700. The timing controller 310 may transmit a detecting signal to the inspection controller 700 and receive a test control signal from the inspection controller 700 in an inspection.

The inspection controller 700 may provide the display device 500 with the test control signal for a defect inspection process. In addition, the inspection controller 700 may receive the detecting signal from the display device 500 by the defect inspection process and display a result of the defect inspection process using the detecting signal.

For example, the inspection controller 700 may provide a test control signal for a bonding inspection process to the display device 500. The inspecting part 230 may detect the resistance value of the plurality of terminals in the data driver 200 in contact with the plurality of pads based on the test control signal. The timing controller 310 may transfer the resistance value to the inspection controller 700. Therefore, the inspection controller 700 may display the resistance value on a monitor. An inspector may check bonding defects of the display device 500 through the resistance value displayed on the monitor.

Figure 2:
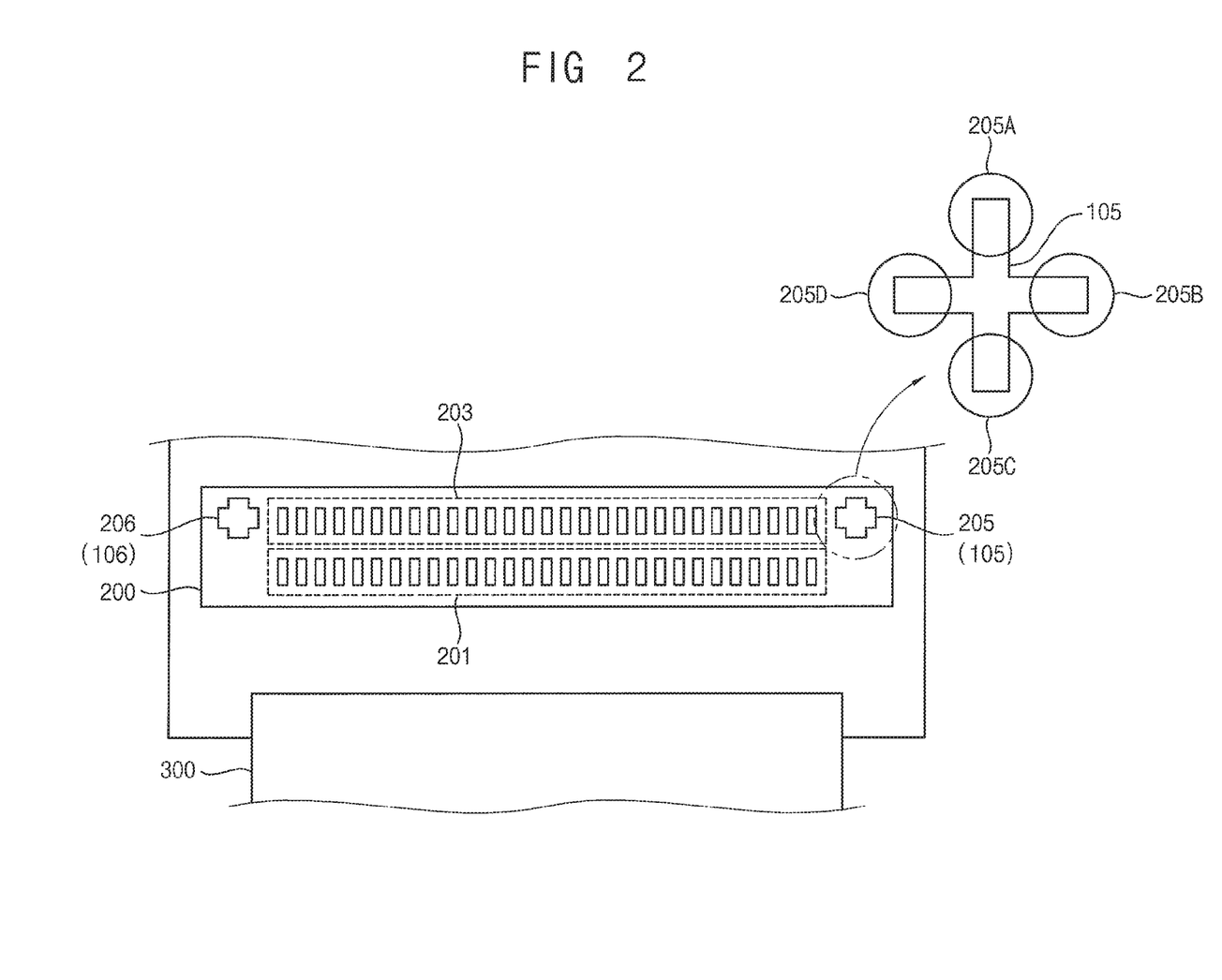
FIG. 2 is a conceptual diagram illustrating a data driver in FIG. 1.

FIG. 2 is a conceptual diagram illustrating a data driver shown in FIG. 1.

Referring to FIGS. 1 and 2, in bonding processes, the plurality of terminals of the data driver 200 may be adhered to the plurality of pads disposed in the peripheral part 130 through the conductive adhesion member.

The data driver 200 may include the plurality of terminals which are arranged on an adhering surface contacted with the display panel 100 and the plurality of terminals may include a plurality of input terminals 201, a plurality of output terminals 203, and at least two align electrode terminals 205 and 206.

After the bonding processes are finished, the plurality of terminals 201, 203, 205, and 206 of the data driver 200 may be electrically and physically in contact with a plurality of pads on the peripheral part 130 through the conductive adhesion member.

According to an exemplary embodiment, the align electrode pads 105 and 106 on the peripheral part 130 may arranged in the align electrode terminals 205 and 206 of the data driver 200 and be adhered to the align electrode terminals 205 and 206 of the data driver 200 through the conductive adhesion member.

The first align electrode terminal 205 may be adhered to the first align electrode pad 105 and the second align electrode terminal 206 may be adhered to the second align electrode pad 106.

For example, as shown in FIG. 2, the first align electrode pad 105 may have a cross shape. When the first align electrode pad 105 has the cross shape, the first align electrode terminal 205 may include a first align electrode 205A, a second align electrode 205B, a third align electrode 205C, and a fourth align electrode 205D corresponding to the cross shape.

The data driver 200 may detect the resistance value from the first align electrode 205A, the second align electrode 205B, the third align electrode 205C, and the fourth align electrode 205D, and output the detecting signal corresponding to the resistance value.

For example, the data driver 200 may detect the resistance value between the first and third align electrodes 205A and 205C in a first direction and the resistance value between the second and fourth align electrodes 205B and 205D in a second direction crossing the first direction. Alternatively, the data driver 200 may detect the resistance value between the first and second align electrodes 205A and 205B and the resistance value between the third and fourth align electrodes 205C and 205D.

The align electrode pads 105 and 106 may have various shapes. The align electrode terminal may include a plurality of align electrodes corresponding to the various shapes of align electrode pads 105 and 106.

A power source voltage for detecting the resistance value between the align electrodes of the plurality of terminals may be received from the inspection controller 700, or alternatively, may be generated in the display device.

Figure 3:
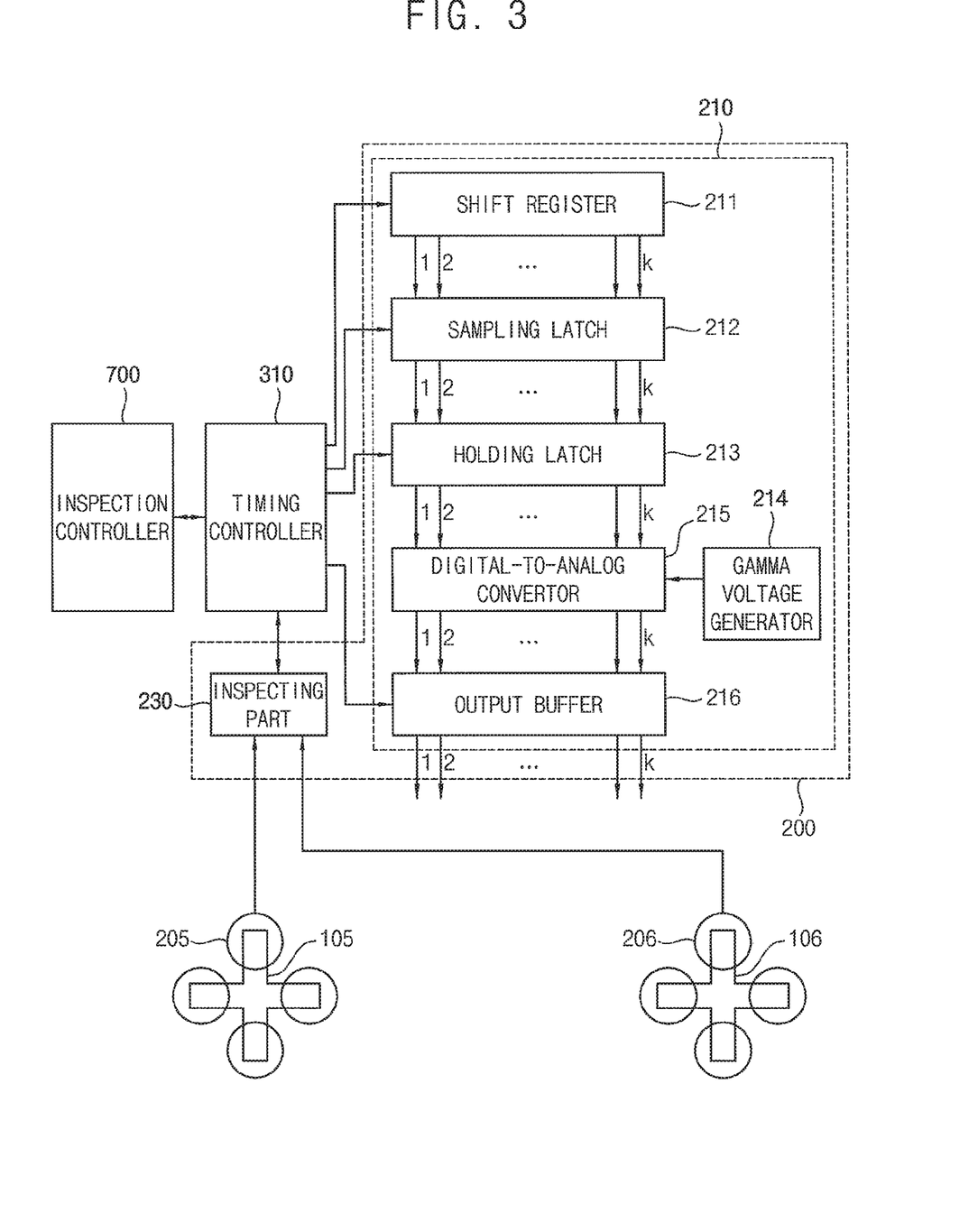
FIG. 3 is a block diagram illustrating the data driver in FIG. 2.

FIG. 3 is a block diagram illustrating the data driver in FIG. 2.

Referring to FIGS. 2 and 3, the data driver 200 may include a data signal processor 210 and an inspecting part 230.

The data signal processor 210 may include a shift register 211, a sampling latch 212, a holding latch 213, a gamma voltage generator 214, a digital-to-analog convertor 215, and an output buffer 216.

The shift register 211 may receive a shift clock signal and a start pulse signal from the timing controller 310. The shift register 211 may shift the start pulse signal by every shift clock signal and then sequentially generate k sampling signals (wherein, 'k' is a natural number).

The sampling latch 212 may sequentially store k image data corresponding to k horizontal lines in response to the k sampling signals.

The holding latch 213 may simultaneously store k image data and output the k image data to the digital-to-analog convertor 215 in response to a load signal received from the timing controller 310.

The gamma voltage generator 214 may generate positive polarity gamma voltages or negative polarity gamma voltages using a plurality of gamma data and a polarity control signal. The positive and negative polarity gamma voltages may be outputted to the digital-to-analog convertor 215.

The digital-to-analog convertor 215 may convert the k image data to k positive or negative polarity data voltages using the polarity control signal and the positive or negative polarity gamma voltages received from the timing controller 310, and output the positive or negative polarity gamma voltages to the output buffer 216.

The output buffer 216 may amplify the k positive or negative polarity data voltages received from the digital-to-analog convertor 215 and output the amplified k positive or negative polarity data voltages to k data lines.

As the described above, the data signal processor 210 may be driven in a display mode in which the display device 100 display the image.

The inspecting part 230 may be performed the bonding inspection process based on the test control signal provided from the inspection controller 700 through the timing controller 310.

In the bonding inspection process, the inspection controller 700 may provide the timing controller 310 with the test control signal, and then the timing controller 310 may control the inspecting part 230 based on the test control signal.

The inspecting part 230 may detect the resistance value between the align electrodes 205 and 206 of the plurality of terminals adhered to the align electrode pads 105 and 106. The inspecting part 230 may provide the timing controller 310 with the resistance value.

The timing controller 310 may transfer the detected resistance value to the inspection controller 700. The inspection controller 700 may display the detected resistance value on the monitor.

Therefore, the inspector may check bonding defects of the display device 500 through the detected resistance value displayed on the monitor. For example, the inspector can determine that the bonding defects occurred when the detected resistance value is more than a reference value.

Figure 4:
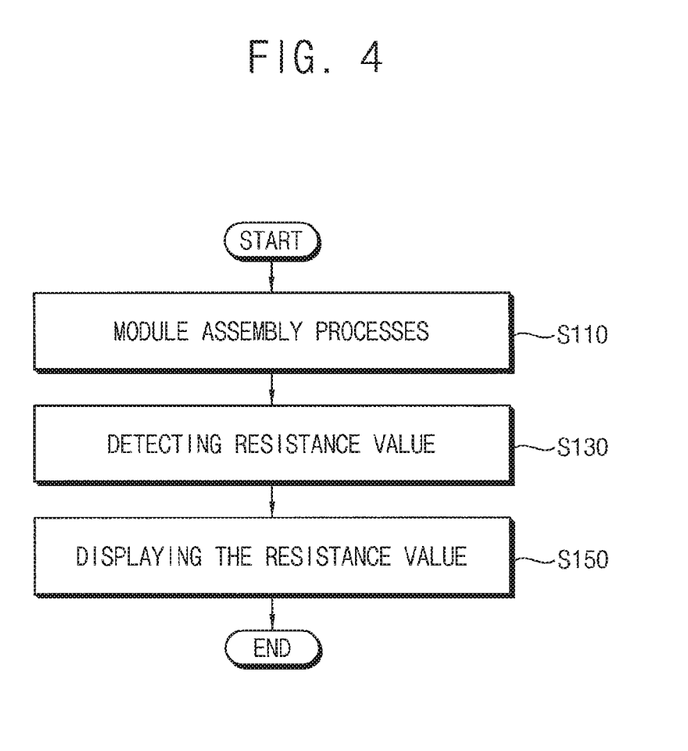
FIG. 4 is a flowchart diagram illustrating a method of inspecting a display device according to one exemplary embodiment.

FIG. 4 is a flowchart diagram illustrating a method of inspecting a display device according to one exemplary embodiment.

Referring to FIGS. 1, 2, 3 and 4, when the display panel 100 is complete, the data driver 200 and the flexible circuit board 300 are adhered to the display panel 100 through the conductive adhesion member. In addition, at least one film member, such as a polarizing plate, a protecting, etc., may be adhered on the display panel 100. The display device 100 may be completed through a module assembly process, as described above (Step S110).

In an exemplary embodiment, the align electrode terminals 205 and 206 of the data driver 200 are arranged in the align electrode pads 105 and 106 in the peripheral part 130 and are adhered to the align electrode pads 105 and 106 through the conductive adhesion member.

As the shown in FIG. 2, the first align electrode terminal 205 may include the first align electrode 205A, the second align electrode 205B, the third align electrode 205C, and the fourth align electrode 205D corresponding to the first align electrode pad 105.

Then, the inspection controller 700 is connected to the display device 100 to enable a communication between the inspection controller 700 and the timing controller 310.

The inspection controller 700 may start the bonding inspection process.

The inspection controller 700 may transfer the test control signal to the timing controller 310 for performing the bonding inspection process and the timing controller 310 may control the inspecting part 230.

The inspecting part 230 may detect the resistance value between the align electrodes 205 and 206 of the align electrode terminals adhered to the align electrode pads 105 and 106 (Step S130).

The inspecting part 230 may transfer the resistance value to the inspection controller 700 through the timing controller 310. The inspection controller 700 may display the resistance value on the monitor (Step S150).

Therefore, the inspector may check bonding defects of the display device 500 through the detected resistance value displayed on the monitor.

Figure 5:
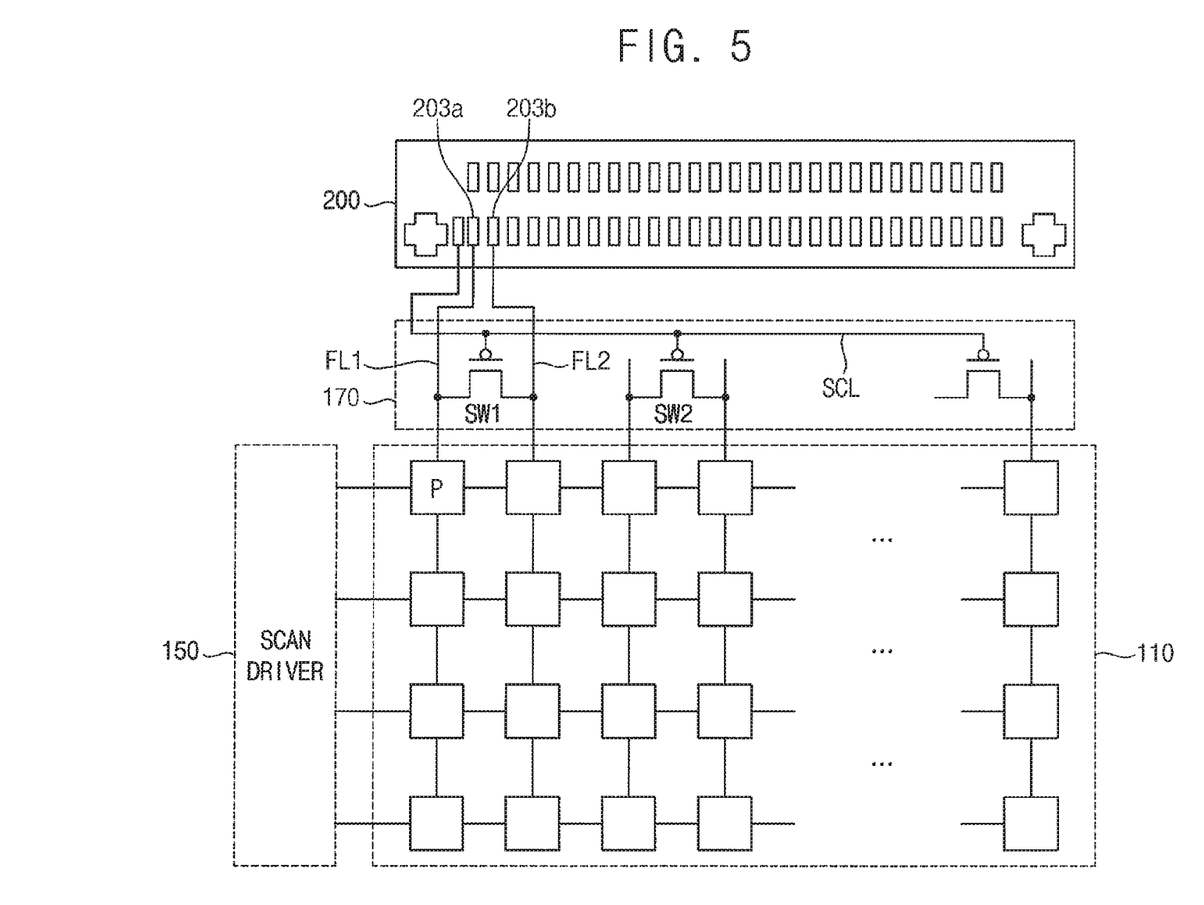
FIG. 5 is a conceptual diagram illustrating a display panel according to one exemplary embodiment.

FIG. 5 is a conceptual diagram illustrating a display panel according to one exemplary embodiment.

Referring to FIGS. 1 and 5, the display panel according to an exemplary embodiment may further include a switching part 170 in comparison with a previous exemplary embodiment.

The switching part 170 may be disposed between the data driver 200 disposed on the display panel and the display part 110.

The switching part 170 may include a switching control line SCL and a plurality of switches SW1 and SW2.

The switching control line SCL may receive a switching control signal from the data driver 200.

Each of the plurality of switches SW1 and SW2 may be connected to an odd numbered fan-out line connected to an odd numbered data line and an even numbered fan-out line connected to an even numbered data line.

For example, a first switch SW1 includes a control electrode connected to the switching control line SCL, a first electrode connected to a first fan-out line FL1 that is the odd numbered fan-out line, and a second electrode connected to a second fan-out line FL2 that is the even numbered.

The first fan-out line FL1 is connected to a first output terminal 203a of the data driver 200 and the second fan-out line FL2 is connected to a second output terminal 203b of the data driver 200.

According to the exemplary embodiment, bonding defects of the display device may be inspected using the data driver 200 disposed in the display device.

For example, when the switching control line SCL receives the switching control signal for turning on the plurality of switches SW1 and SW2, the first fan-out line FL1 and the second fan-out line FL2 may be formed a closed loop state through the first switch SW1, which is turned on.

In the closed loop state, the data driver 200 may detect the resistance value between the first and second output terminals 203a and 203b.

In a state in which the switching part 170 is turned on, the data driver 200 may detect the resistance value between the odd numbered terminal and the even numbered output terminal of the data driver 200 adhered to the plurality of pads of the display panel 100.

However, when the switching control line SCL receives a switching control signal for turning off the plurality of switches SW1 and SW2, the first switch SW1 is turned off and then the first fan-out line FL1 and the second fan-out line FL2 are electrically opened from each other. Therefore, the odd numbered data line and the even numbered data line may be electrically opened from each other.

Figure 6:
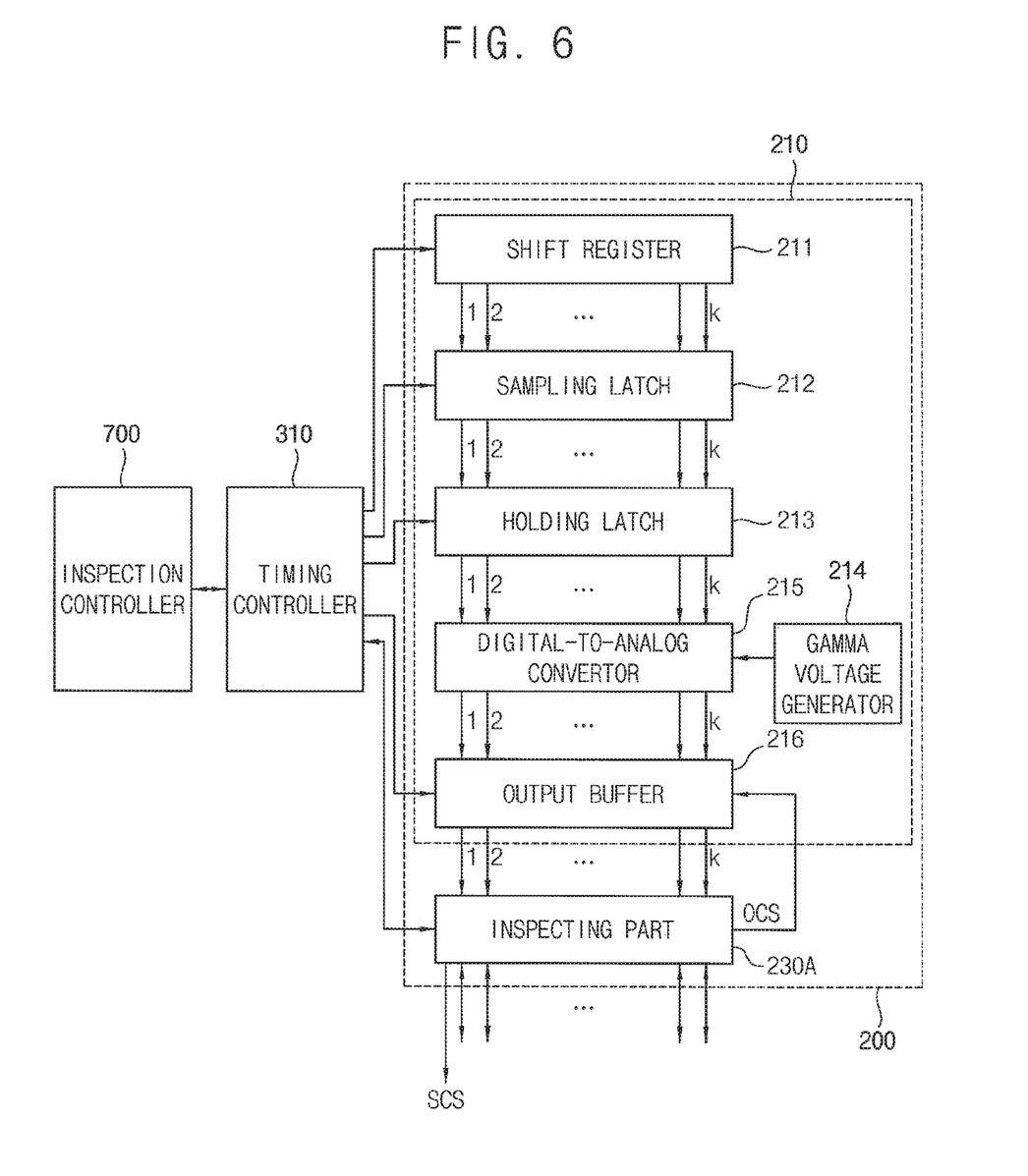
FIG. 6 is a block diagram illustrating the data driver in FIG. 5.

FIG. 6 is a block diagram illustrating the data driver in FIG. 5.

Referring to FIGS. 5 and 6, the data driver 200 may include a data signal processor 210 and an inspecting part 230A.

The data signal processor 210 may include a shift register 211, a sampling latch 212, a holding latch 213, a gamma voltage generator 214, a digital-to-analog convertor 215, and an output buffer 216.

The data signal processor 210 may include the same or like parts as those described in the previous exemplary embodiment referring to FIG. 2, and the same detailed explanations are not repeated unless necessary.

The inspecting part 230A may perform a bonding inspection process, which inspects the bonding defects, and an array inspection process, which inspects electrical defects, of signals lines based on a control of a timing controller 310.

The inspecting part 230A is configured to generate an output control signal OCS to block an operating voltage applied to the output buffer 216, which is the last driving block in the data signal processor 210 in the bonding inspection process.

The inspecting part 230A is configured to provide the output buffer 216 with the output control signal OCS. The output buffer 216 may block the operating voltage from being applied to the output buffer 216 in response to the output control signal OCS. Thus, in the bonding inspection process, the data signal processor 210 does not output an output signal to the inspecting part 230A.

In the bonding inspection process, the inspecting part 230A is configured to generate a switch control signal SCS for turning on the switching part 170. In addition, the inspecting part 230A is configured to generate a reference signal to detect the resistance value between the odd and even numbered output terminals of the data driver 200. The reference signal may be a voltage or a current.

The switching control signal SCS is outputted through the switching control line SCL of the display panel 100. The reference signal is outputted through the output terminals of the data driver 200.

The switching part 170 is turned on in response to the switching control signal SCS provided from the switching control line SCL.

When the switching part 170 is turned on, the odd numbered fan-out line (e.g., FL1) and the even numbered fan-out line (e.g., FL2) may form a closed loop state through the turned-on switching part 170.

In a state in which the switching part 170 is turned on, the inspecting part 230A may detect the resistance value between the odd numbered terminal and the even numbered output terminal of the data driver 200 adhered to the plurality of pads of the display panel 100.

In the array inspection mode which inspects the electrical defects, the inspecting part 230A is configured to provide the output buffer 216 with the output control signal OCS. The output buffer 216 is configured to block the operating voltage from being applied to the output buffer 216 in response to the output control signal OCS. Thus, in the array inspection mode, the data signal processor 210 does not output an output signal to the inspecting part 230A The inspecting part 230A is configured to generate the switch control signal SCS for turning off the switching part 170 in the array inspection mode. The switching control signal SCS is outputted through the switching control line SCL of the display panel 100.

When the switching part 170 is turned off, the odd numbered fan-out line (e.g., FL1) and the even numbered fan-out line (e.g., FL2) are electrically opened from each other.

The inspecting part 230A is configured to output the test signal to the plurality of data lines DL in array inspection mode.

The test signal may be outputted to the plurality of data lines DL through the output terminals of the data driver 200. The test signal may be a predetermined grayscale voltage, such as a white grayscale or a black grayscale voltage. The test signal is applied to the plurality of data lines DL of the display part 110.

However, in the array inspection mode, the timing controller 310 may provide the scan driver 150 with a scan driving signal. The scan driving signal may include a start pulse signal and a plurality of clock signals. The scan driver 150 may output a plurality of scan signals to a plurality of scan lines of the display part 110 based on the scan driving signal.

In the array inspection mode, a plurality of pixels P of the display panel 100 may display a predetermined grayscale corresponding to the test signal. Thus, the electrical defect of a data line may be inspected by a pixel which does not display the predetermined grayscale. In addition, the electrical defect of a scan line may be inspected by a pixel row which does not display the predetermined grayscale.

As described above, in the array inspection mode, the inspecting part may inspect electrical defects (e.g., open and short circuits) of the plurality of data lines and the plurality of scan lines.

Figure 7:
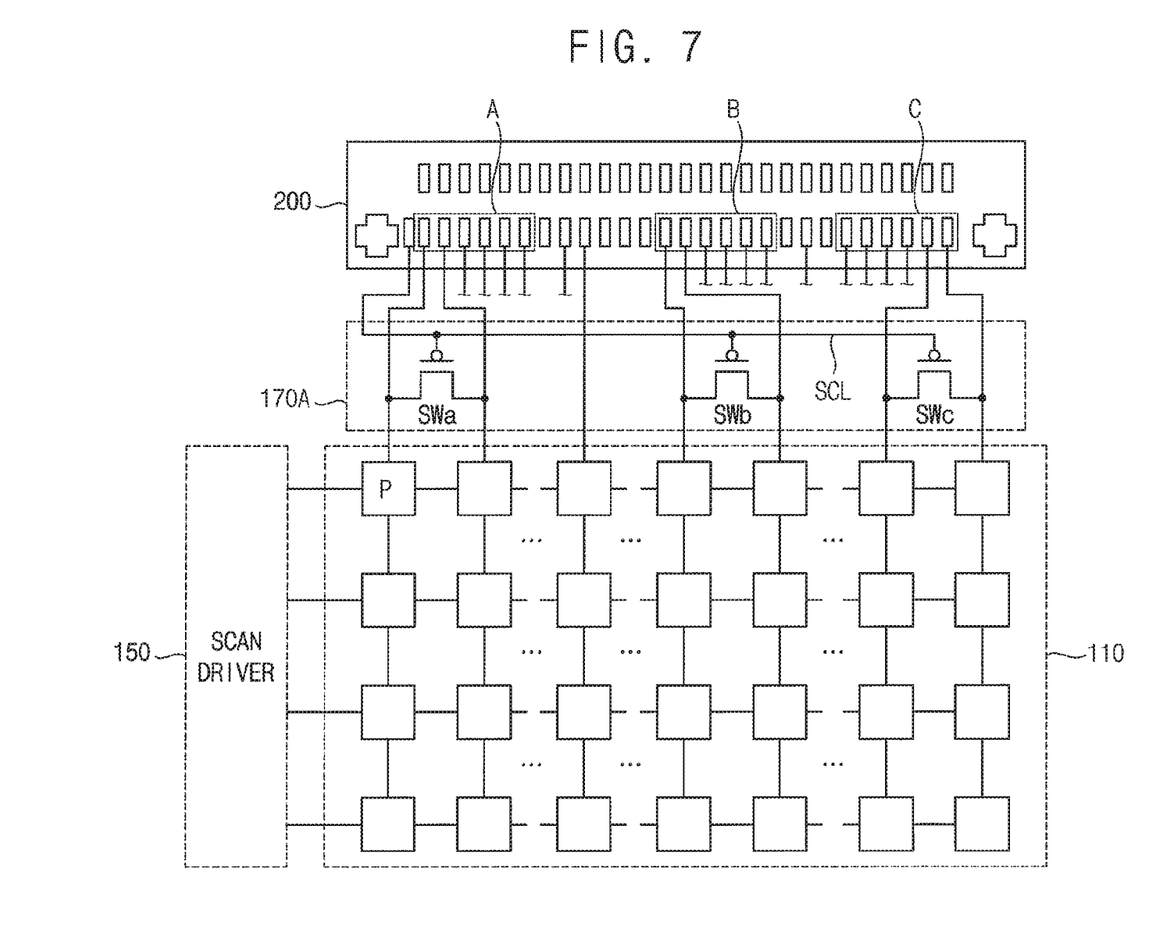
FIG. 7 is a conceptual diagram illustrating a display panel according to one exemplary embodiment.

FIG. 7 is a conceptual diagram illustrating a display panel according to one exemplary embodiment.

Referring to FIGS. 1 and 7, the display panel according to an exemplary embodiment include a switching part 170A different from the switching part 170 of the previous exemplary embodiment referring to FIG. 5

The switching part 170A may be disposed between the data driver 200 disposed on the display panel 100 and the display part 110.

The switching part 170A may include a plurality of switches SWa, SWb, and SWc respectively corresponding to a plurality of groups A, B, and C selectively sampling the plurality of output terminals in the data driver 200.

For example, first switches SWa are connected to a plurality of fan-out lines, which are connected to the output terminals of a first group A. Each first switch SWa includes a control electrode connected to the switching control line SCL, a first electrode connected to the odd numbered fan-out line, and a second electrode connected to the even numbered fan-out line.

Second switches SWb are connected to a plurality of fan-out lines, which are connected to the output terminals of a second group B. Each second switch SWb includes a control electrode connected to the switching control line SCL, a first electrode connected to the odd numbered fan-out line, and a second electrode connected to the even numbered fan-out line.

Third switches SWc are connected to a plurality of fan-out lines, which are connected to the output terminals of a third group C. Each third switch SWc includes a control electrode connected to the switching control line SCL, a first electrode connected to the odd numbered fan-out line, and a second electrode connected to the even numbered fan-out line.

Referring to FIGS. 6 and 7, in the bonding inspection process, the inspecting part 230A is configured to provide the switching part 170A with a switch control signal SC through the switch control line SCL. In addition, the inspecting part 230A is configured to output the reference signal for detecting the resistance value to output terminals of the data driver 200.

The switching part 170A is turned on in response to the switching control signal SCS applied to the switching control line SCL.

When the switching part 170A is turned on, the odd and even numbered fan-out lines connected to output terminals of the first, second, and third groups A, B and C may be formed a closed loop state, respectively.

The inspecting part 230A may detect the resistance value of the output terminals of the first, second, and third groups A, B, and C in the plurality of output terminals of the data driver 200.

However, in the array inspection mode, methods of driving the inspecting part 230A may be the same as those described in the previous exemplary embodiment referring to FIG. 6, and the same detailed explanations are not repeated unless necessary.

Figure 8:
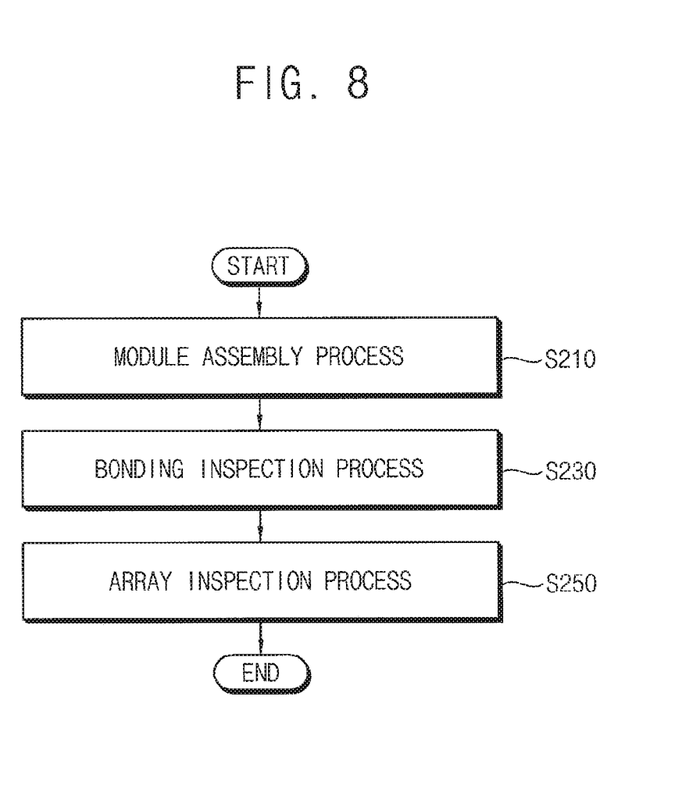
FIG. 8 is a flowchart diagram illustrating a method of inspecting a display device according to one exemplary embodiment.

FIG. 8 is a flowchart diagram illustrating a method of inspecting a display device according to one exemplary embodiment.

Referring to FIGS. 1, 5, 6, and 8, when the display panel 100 is complete, the data driver 200 and the flexible circuit board 300 are adhered to the display panel 100 through the conductive adhesion member. In addition, at least one film member, such as a polarizing plate, a protecting plate, etc., may be adhered on the display panel 100. The display device 100 may be completed through a module assembly process, as described above (Step S210).

For example, as the shown in FIG. 5, the data driver 200 is adhered to the plurality of pads on the display panel through the conductive adhesion member.

Then, the inspection controller 700 is connected to the display device 100 to enable a communication between the inspection controller 700 and the timing controller 310.

The inspection controller 700 may start the bonding inspection process.

The inspection controller 700 may transfer the test control signal to the timing controller 310 for performing the bonding inspection process (Step S230).

The inspecting part 230A of the data driver 200 is configured to generate the output control signal OCS for performing the bonding inspection process and the switching control signal SCS having an ON voltage based on a control of the timing controller 310.

The inspecting part 230A is configured to provide the output buffer 216 with the output control signal OCS, and the output buffer 216 is configured to block the operating voltage from being applied to the output buffer 216 in response to the output control signal OCS.

The inspecting part 230A is configured to output the switching control signal SCS to the switching control line SCL of the display panel 100.

Referring to FIG. 5, according to an exemplary embodiment, the switching part 170 is turned on in response to the switching control signal SCS applied to the switching control line SCL.

When the switching part 170 is turned on, the odd numbered fan-out line and the even numbered fan-out line form a closed loop state by the switching part 170 which is turned on.

In a state in which the switching part 170 is turned on, the inspecting part 230A may detect the resistance value between the odd numbered terminal and the even numbered output terminal of the data driver 200 adhered to the plurality of pads of the display panel 100.

In addition, referring to FIG. 7, according to an exemplary embodiment, the switching part 170A is turned on in response to the switching control signal SCS applied to the switching control line SCL.

When the switching part 170A is turned on, the odd and even numbered fan-out lines connected to output terminals of the first, second, and third groups A, B and C may form a closed loop state, respectively.

The inspecting part 230A may detect the resistance value of the output terminals of the first, second, and third groups A, B, and C in the plurality of output terminals of the data driver 200.

As described above, the inspecting part 230A transfers the resistance value to the inspection controller 700 through the timing controller 310. The inspection controller 700 displays the resistance value on the monitor to complete the bonding inspection process (Step S230).

Then, the inspection controller 700 may perform the array inspection process.

The inspecting part 230A of the data driver 200 is configured to generate the output control signal OCS for performing the array inspection process and the switching control signal SCS having an OFF voltage based on a control of the timing controller 310.

The output buffer 216 is configured to block the operating voltage from being applied to the output buffer 216 in response to the output control signal OCS.

The switching part 170A is turned off in response to the switching control signal SCS having an OFF voltage. The odd and even numbered fan-out lines of the display panel are electrically opened from each other.

The inspecting part 230A is configured to generate the test signal, and to output the test signal to a plurality of data lines of the display part 110 through the output terminals of the data driver 200.

In synchronization with an output timing of the test signal, the scan driver 150 is configured to output a plurality of scan signals to a plurality of scan lines of the display part 110.

As the described above, in the array inspection mode, the inspecting part 230A may inspect electrical defects (e.g., open and short circuits) of the plurality of data lines and the plurality of scan lines (Step S250).

According to the exemplary embodiment, the bonding inspection process and the array inspection process of the display device may be performed using the data driver in the display device.

According to the exemplary embodiments, the data driver detects the resistance value of output terminals in the data driver bonded on the display panel and the resistance value is displayed on the monitor and thus, the bonding inspection process may be automated. In addition, the data driver may perform the bonding inspection process and the array inspection process and thus, the inspection processes may be performed accurately.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

Although certain exemplary embodiments have been described herein, other embodiments and modifications will be apparent from this description. In the claims, means-plusfunction clauses are intended to cover the structures described herein as performing the recited function and not only structural equivalents but also equivalent structures. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel comprising a plurality of pixels connected to a plurality of data lines and a plurality of gate lines crossing the plurality of data lines;
a data driver comprising a plurality of terminals in contact with a plurality of pads on the display panel through a conductive adhesive member and configured to detect a resistance value of the plurality of terminals; and
a timing controller configured to transfer the resistance value to an external controller.

2. The display device of claim 1, wherein:
the plurality of terminals of the data driver comprise an align electrode terminal arranged in an align electrode pad disposed on the display panel; and
the data driver is configured to detect the resistance value of the align electrode terminal in contact with the align electrode pad.

3. The display device of claim 1, wherein:
the display panel further comprises a switching part disposed in an area adjacent to the data driver; and
the switching part comprises:
a switching control line; and
a switch connected to the switching control line, an odd numbered fan-out line, and an even numbered fan-out line adjacent to the odd numbered fan-out line.

4. The display device of claim 3, wherein the data driver is configured to provide the switching control line with a switching control signal for turning on the switch, and to detect the resistance value of the plurality of terminals when the switching part is turned on.

5. The display device of claim 3, wherein the switching part comprises:
a switching control line;
a first switch connected to the switching control line, and the odd and even numbered fan-out lines connected to terminals of a first group among the plurality of terminals of the data driver; and
a second switch connected to the switching control line, and the odd and even numbered fan-out lines connected to terminals of a second group among the plurality of terminals of the data driver.

6. The display device of claim 5, wherein, in response to the switching part being turned on, the data driver is configured to provide the switching control line with a switching control signal for turning on the switch, and to detect the resistance value of the terminals of the first group and the resistance value of the terminals of the second group.

7. The display device of claim 3, wherein the data driver comprises:
an output buffer configured to amplify a data voltage corresponding to image data and output the data voltage to the plurality of the data lines; and
an inspecting part configured to detect the resistance value.

8. The display device of claim 7, wherein the inspecting part is configured to block an operating voltage from being applied to the output buffer in an inspection mode in which the resistance value is detected.

9. The display device of claim 7, wherein the inspecting part is configured to output a test signal to the plurality of data lines in an inspection mode which inspects whether the plurality of data lines has electrical defects.

10. The display device of claim 9, wherein the inspecting part is configured to block an operating voltage from being applied to the output buffer in the inspection mode.

11. A method of inspecting a display device which comprises a plurality of pixels connected to a plurality of data lines and a plurality of gate lines crossing the plurality of data lines, and a data driver comprising a plurality of terminals in contact with a plurality of pads on the display panel through a conductive adhesive member, the method comprising:
detecting a resistance value of the plurality of terminals, by the data driver; and
transferring the resistance value to an external controller.

12. The method of claim 11, wherein the plurality of terminals of the data driver comprises an align electrode terminal arranged in an align electrode pad disposed on the display panel, and the data driver is configured to detect the resistance value of the align electrode terminal contacted to the align electrode pad.

13. The method of claim 11, further comprising:
turning on a switch connected to an odd numbered fan-out line and an even numbered fan-out line adjacent to the odd numbered fan-out line, by the driver; and
detecting the resistance value of the plurality of terminals of the data driver connected to the odd and even numbered fan-out lines, by the driver.

14. The method of claim 11, further comprising:
turning on a first switch connected to the switching control line and the odd and even numbered fan-out lines connected to terminals of a first group among the plurality of terminals, by the driver;
turning on second switch connected to the switching control line and the odd and even numbered fan-out lines connected to terminals of a second group among of the plurality of terminals, by the driver; and
detecting the resistance value of the terminals in the first and second group, by the driver.

15. The method of claim 11, wherein:
the data driver comprises an output buffer configured to amplify a data voltage corresponding to image data and output the data voltage to the plurality of the data lines; and
the data driver blocks an operating voltage from being applied to the output buffer in an inspection mode in which the resistance value is detected.

16. The method of claim 11, further comprising outputting a test signal to the plurality of data lines in an inspection mode which inspects whether the plurality of data lines have electrical defects, by the data driver.

17. The method of claim 16, further comprising blocking an operating voltage from being applied to the output buffer in the inspection mode, by the data driver.

* * * * *